(12) United States Patent
Sullivan et al.

(10) Patent No.: US 6,357,864 B1
(45) Date of Patent: Mar. 19, 2002

(54) TAB CIRCUIT DESIGN FOR SIMPLIFIED USE WITH HOT BAR SOLDERING TECHNIQUE

(75) Inventors: Carl Edmond Sullivan, Versailles; Frank Edward Anderson, Sadieville; Paul Timothy Spivey, Nicholasville; Kris Ann Reeves, Union; Gary Raymond Williams; Jeanne Marie Saldanha Singh, both of Lexington, all of KY (US)

(73) Assignee: Lexmark International, Inc., Lexington, KY (US)

( * ) Notice: Subject to any disclaimer, the term of this patent is extended or adjusted under 35 U.S.C. 154(b) by 0 days.

(21) Appl. No.: 09/464,969

(22) Filed: Dec. 16, 1999

(51) Int. Cl.⁷ .................. B41J 2/05; B41J 2/01
(52) U.S. Cl. .................................. 347/58; 347/50
(58) Field of Search .................. 347/58, 50, 59, 347/57, 56, 54, 20

(56) References Cited

U.S. PATENT DOCUMENTS

| | | | |
|---|---|---|---|
| 4,715,928 A | * 12/1987 | Hamby ...................... 156/630 |
| 4,802,859 A | 2/1989 | Gouldy et al. |
| 4,881,318 A | 11/1989 | Komuro et al. |
| 5,162,814 A | * 11/1992 | Shirakawa et al. ......... 347/203 |
| 5,173,766 A | 12/1992 | Long et al. |
| 5,244,833 A | 9/1993 | Gansauge et al. |
| 5,257,714 A | 11/1993 | Beers et al. |
| 5,260,168 A | 11/1993 | Vernon |
| 5,297,331 A | * 3/1994 | Childers ...................... 29/611 |
| 5,420,627 A | 5/1995 | Keefe et al. |
| 5,442,384 A | 8/1995 | Schantz et al. |
| 5,442,386 A | 8/1995 | Childers et al. |
| 5,489,804 A | 2/1996 | Pasch |
| 5,521,425 A | 5/1996 | Deeney |
| 5,646,660 A | 7/1997 | Murray |
| 5,678,287 A | 10/1997 | Smith et al. |
| 5,689,296 A | 11/1997 | Heitmann et al. |
| 5,692,297 A | 12/1997 | Noda |
| 5,748,209 A | * 5/1998 | Chapman et al. ............ 347/50 |
| 5,760,797 A | * 6/1998 | Koizumi et al. ............. 347/14 |
| 6,164,762 A | * 12/2000 | Sullivan et al. .............. 347/56 |
| 6,174,046 B1 | * 1/2001 | Reid et al. .................... 347/50 |
| 6,190,002 B1 | * 2/2001 | Spivey ........................ 347/50 |
| 6,209,983 B1 | * 4/2001 | Osborne et al. ............. 347/32 |

FOREIGN PATENT DOCUMENTS

EP          0804990 A1      11/1997

* cited by examiner

Primary Examiner—N. Le
Assistant Examiner—Matthew T. Welker
(74) Attorney, Agent, or Firm—D. Brent Lambert; Michael T. Sanderson; David E. LaRose (57) ABSTRACT

The invention provides a printhead cartridge body contained within an inkjet printer which contains a tape automated bonding (TAB) circuit, having a unique architecture, electrically connected to a printhead heater chip and a printed circuit board (PCB). Moreover, the TAB circuit architecture is readily sealable by a variety of methods. The TAB circuit includes elongate apertures which have a length axis aligned perpendicular to electrical traces which run through the apertures. Each trace has a first end running through the apertures and being connected to a PCB by means of a hot bar soldering technique and the second end of the traces being connected to a printhead heater chip. An encapsulant layer substantially encloses the rectangular apertures and electrical connections preventing ink mist from contacting the connections. The TAB circuit design provides improvement in the manufacturing process and enables rework of connections without destroying the TAB circuit.

15 Claims, 4 Drawing Sheets

Fig. 3B
VIEW A-A

Fig. 3C

Fig. 3D
VIEW B-B

TAB CIRCUIT DESIGN FOR SIMPLIFIED USE WITH HOT BAR SOLDERING TECHNIQUE

TECHNICAL FIELD

This invention relates to the field of printhead cartridge bodies contained within inkjet printers. More particularly, this invention relates to a printhead cartridge body which includes a tape automated bonding (TAB) circuit having a plurality of apertures for connecting to a printed circuit board (PCB) and a printhead heater chip located on the printhead cartridge body.

BACKGROUND OF THE INVENTION

Tape automated bonding (TAB) circuits are improved circuit mounting structures that are used to interconnect electronic elements in advanced microelectronic devices. TAB circuits can be used to electrically connect a semiconductor chip to a printed circuit board (PCB). Misalignment errors are common when connecting the TAB circuit to the PCB. Many TAB circuits are constructed having a polyimide layer enclosing the conductive traces, so visually inspecting the circuits for proper alignment is difficult. Furthermore, testing the circuit for open or short circuits can be a time consuming and expensive process since the electrical connections are not easily accessible. In prior art TAB circuits applications, misalignment errors were corrected by physically disassembling the connected circuits which usually destroyed one or both of the circuits.

Hot bar refers to the use of a heated metal or ceramic bar which is an efficient connection method used to form a solder joint between many electrical connectors at the same time. Hot bar is a technique that can be used to interconnect a flexible circuit to a PCB. Particularly, hot bar can be used to interconnect a PCB to a flexible TAB circuit.

In many hot bar applications, a flexible polyimide TAB circuit with conductive traces on one side of the circuit is connected to the electrical connectors of a PCB by transferring the heat from the hot bar through the polyimide and into the circuit trace. The transferred heat causes the PCB's solder to flow, which electrically connects the PCB to the TAB circuit. Flexible TAB circuit designs sometimes utilize a small opening as a vent so that excess solder can flow away from the electrical connections. Since the traces of a TAB circuit are covered by polyimide, which acts as an insulator, the hot bar must transfer heat first through the polyimide layer before transferring heat to the underlying traces and PCB solder. By forcing heat transfer through a polyimide layer first, longer hot bar application times or higher heating temperatures are required, resulting in increased bonding time and production costs. The increased hot bar temperatures may also be detrimental to the polyimide material which may cause premature failure of the flex circuit.

Complications may occur if it is determined that an electrical connection within the PCB/TAB circuit configuration might be defective and the electrical connections need to be inspected. Since there is a polyimide surface covering the electrical connections, the entire circuit has to be removed to rework the electrical connections. Removing the circuit can destroy or significantly impair the electrical connectors of both the PCB and the TAB circuit. As a consequence, rework can be quite an expensive process.

TAB circuitry is useful since the traces and polyimide can be configured to the users specifications in a cost effective manner. However, because printhead cartridge body space is constrained by the area of printer, TAB circuit designs have been correspondingly limited. Therefore, improvements to the TAB circuit architecture are limited by the amount of TAB circuit surface area.

Adding to the design criteria of the TAB circuitry utilized within an inkjet printer is the ink contained within the printer. Ink is a highly corrosive contaminant to any exposed metal that is subjected to the ink. TAB circuitry containing exposed conductive metal traces will be subject to the highly corrosive ink within the inkjet printer and correspondingly the trace material can degrade after a short period of time, normally resulting in a short or open circuit.

What is needed therefore, is a TAB circuit which reduces hot bar processing times and temperatures, while enabling easy access to the electrical connections when the TAB circuit is being connected to a PCB. Furthermore, there is a need for preventing corrosion and deterioration of the electrical connections from ink mist within the inkjet printer.

SUMMARY OF THE INVENTION

With regard to the above, and other objects, the invention provides a printhead cartridge body for an inkjet printer which includes a TAB circuit having a unique architecture for improved manufacturing operations. Moreover, the TAB circuit architecture is readily sealable by a variety of methods.

The printhead cartridge body includes a TAB circuit having a first region, which further includes a first face and a second face. The first region of the TAB circuit also includes a first axis and a second axis that is substantially perpendicular to the first axis. The TAB circuit includes a second region, which contains a first face and a second face. The second region of the TAB circuit also includes a first axis and a second axis that is substantially perpendicular to the first axis.

A plurality of conductive traces are located on the second face of the first region and on the second face of the second region of the TAB circuit. Each trace has a first end and a second end. The first end of each trace is substantially parallel with the second axis of the first region of the TAB circuit. The second end of each trace is electrically connected to a printhead heater chip.

The first region of the TAB circuit contains at least two rectangular apertures. A length and a width define each aperture. A first axis extends along the length of each aperture and a second axis extends along the width of each aperture. The first axis of each aperture is aligned with the first axis of the first region of the TAB circuit. The second axis of each aperture is aligned with the second axis of the first region of the TAB circuit. An encapsulant layer is provided which substantially encloses the rectangular apertures preventing ink mist from penetrating into the apertures.

The printhead cartridge body also contains a PCB having a first face and a second face. The PCB includes a first axis and a second axis substantially perpendicular to the first axis. The PCB also includes a plurality of conductive contacts. The conductive contacts are electrically connected to the first ends of the conductive traces of the TAB circuit. The first face of the PCB is arranged adjacent to the second face of the first region of the TAB circuit. Furthermore, the first axis of the PCB is aligned substantially parallel with the first axis of the first region of the TAB circuit.

Additionally, the printhead cartridge body includes a printhead heater chip, having a first face and a second face. The printhead heater chip has a first axis and a second axis that is substantially perpendicular to the first axis. The printhead heater chip also includes a plurality of conductive contacts. The conductive contacts are electrically connected to the second ends of the conductive traces of the TAB circuit. The first face of the printhead heater chip is arranged adjacent the second face of the second region of the TAB circuit. Moreover, the first axis of the printhead heater chip is aligned substantially parallel with the first axis of the second region of the TAB circuit.

The printhead cartridge body including the TAB circuit with PCB region apertures as described above, is advantageous in a variety of ways. First, the hot bar cycle time period is much faster since heat does not have to be transferred through the polyimide layer, because the hot bar is applied directly to the exposed TAB circuit traces and solder on the conductive contacts of the PCB. Secondly, solder can flow around the entire TAB circuit lead providing a stronger junction between the TAB circuit and the PCB. In prior art systems, where KAPTON or analogous polymeric material covers one side of the lead, only the bottom and sides of the lead can come into contact with the solder, resulting in a weaker junction.

Furthermore, visual inspecting and reworking solder bridges and open circuits is no longer a major ordeal because the aperture locations allow easy access to the resulting circuit for repairs. For example, a KAPTON circuit that has no aperture or only vent holes will require that the entire circuit be removed to perform any kind of circuit repair. Removing the circuit normally destroys either the PCB, the flexible TAB circuit, or both.

Another advantage of the present invention is aperture orientation. The apertures are oriented on the TAB circuit so that the first axis of each aperture is aligned with the first axis of the first region of the TAB circuit. The second axis of each aperture is aligned with the second axis of the first region of the TAB circuit. By orienting the apertures on the TAB circuit as described above, the amount of printhead cartridge body space needed to accommodate the TAB circuit can be minimized. Furthermore, alignment error translation along the length of the TAB circuit is also effectively reduced.

By orienting the apertures in the above described fashion, chip/nozzle plate skew concerns are lessened. Chip/nozzle plate to TAB circuit skew is caused by angular misalignment of the chip/nozzle plate and the TAB circuit which translates along the length of the TAB circuit (i.e. alignment error translation), potentially creating a large misalignment error relative to the TAB circuit's second (width) axis. The aperture orientation according to the invention, enables a fairly wide range of chip/nozzle plate to TAB circuit misalignment before serious degradation occurs and provides increased degrees of freedom with respect to alignment of the printhead and cartridge body components.

This invention also provides a method for sealingly connecting a FAB circuit having at least two apertures arranged in the circuit board region of the TAB circuit to a PCB. The method pertains to connecting the TAB circuit to a printhead heater chip and PCB in a printhead cartridge body for use in an inkjet printer.

The TAB circuit contains a printhead heater chip located in the printhead region of the TAB circuit. The TAB circuit is attached to an inkjet printer printhead cartridge body. The second face of the circuit board region of the TAB circuit is positioned adjacent to the first face of the PCB by substantially aligning the first axis of the circuit board region of the TAB circuit with the first axis of the PCB. A heating means is applied to traces disposed on the second face of the circuit board region of the TAB circuit through the apertures thereby fixedly connecting the traces of the TAB circuit to conductive contacts on the PCB. A sealant is applied to the apertures of the TAB circuit preventing ink from contacting and/or corroding the circuitry and connections.

The method described above provides several benefits not found in the prior art. First, hot bar application time is reduced since there is not a polyimide or similar type of surface covering the conductive traces of the TAB circuit. Therefore, heat transfer cycle time is reduced since the hot bar is directly applied to the conductive traces and corresponding conductive contacts. Secondly, the apertures allow greater misalignment flexibility when applying the TAB circuit to the PCB, which also reduces the application time since a high degree of precision is not required when mating the two components. Furthermore, the apertures allow visual inspection aiding in the alignment of the TAB circuit to the PCB.

Finally, sealant application is a simple process since the leads on the top and bottom of the circuit are exposed through the apertures. Also, with the design according to the invention, any conventional method of sealing can be used. Furthermore, sealing the apertures with a flowable encapsulant material adds mechanical strength to the enclosed bond between the conductive traces of the TAB circuit and the conductive contacts of the PCB. With prior art systems where apertures are not provided, the soldered area has to be sealed from the sides or an adhesive/encapsulant has to be put down prior to use of the hot bar, neither method providing a cost effective sealing method.

For purposes of simplifying the description, the invention will be described with respect to use of TAB circuits for connecting between the printhead and PCB. However, it will be recognized by those of ordinary skill in the art that the features and advantages of the invention also apply to the use of flexible circuits for connecting between the printheads and PCB.

BRIEF DESCRIPTION OF THE DRAWINGS

Further advantages of the invention will become apparent by reference to the detailed description of preferred embodiments when considered in conjunction with the drawings, which are not to scale, wherein like reference characters designate like or similar elements throughout the several drawings as follows.

DETAILED DESCRIPTION OF THE INVENTION

Figure 1:
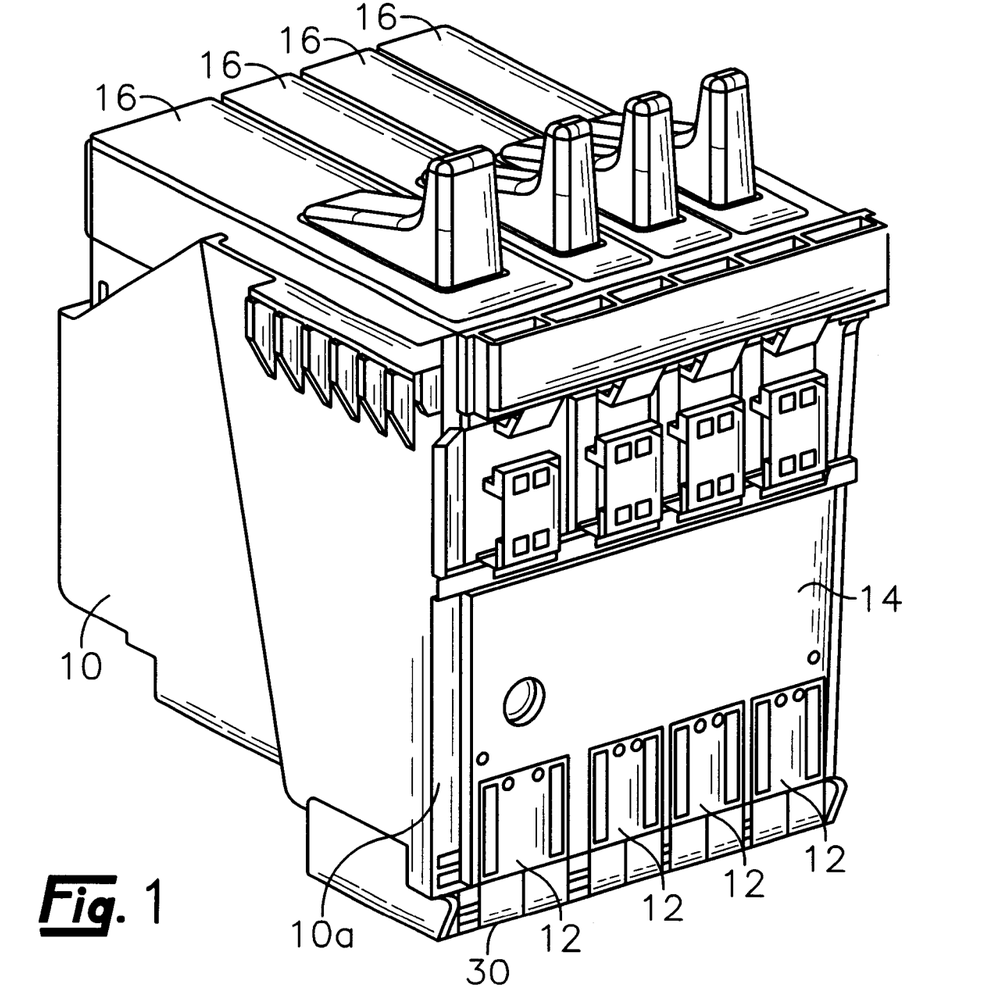
FIG. 1 is a perspective view of printhead cartridge body containing a plurality of TAB circuits and a PCB, according to the present invention.

Referring to FIG. 1, a printhead cartridge body 10 is shown accommodating at least one, and preferably multiple, TAB circuits 12 and a PCB 14, according to the present invention. Printhead cartridge body 10 is utilized in an inkjet printer. The printhead cartridge body 10 includes one or more permanent or semi-permanent printheads and structures for attachment of one or more replaceable ink cartridges 16 thereto. The specific design features of the printheads, cartridge body 10 and cartridges 16 are not critical to the invention.

In describing the construction of the printhead cartridge body 10, it is useful to have points of reference, from which the angular position and alignment of the various elements can be described. In this description, these points of reference are given the names "first axis" and "second axis". The first axis and second axis are not physical elements of the components described within printhead cartridge body 10, but are geometrical constructs of a straight line that run from one end of each component to the other. As the various physical elements of the printhead cartridge body 10 are introduced, their position and orientation are often referenced in regard to first and second axis of a reference element, as this tends to provide a more distinct understanding of the printhead cartridge body 10 and the features of the invention.

Figure 2:
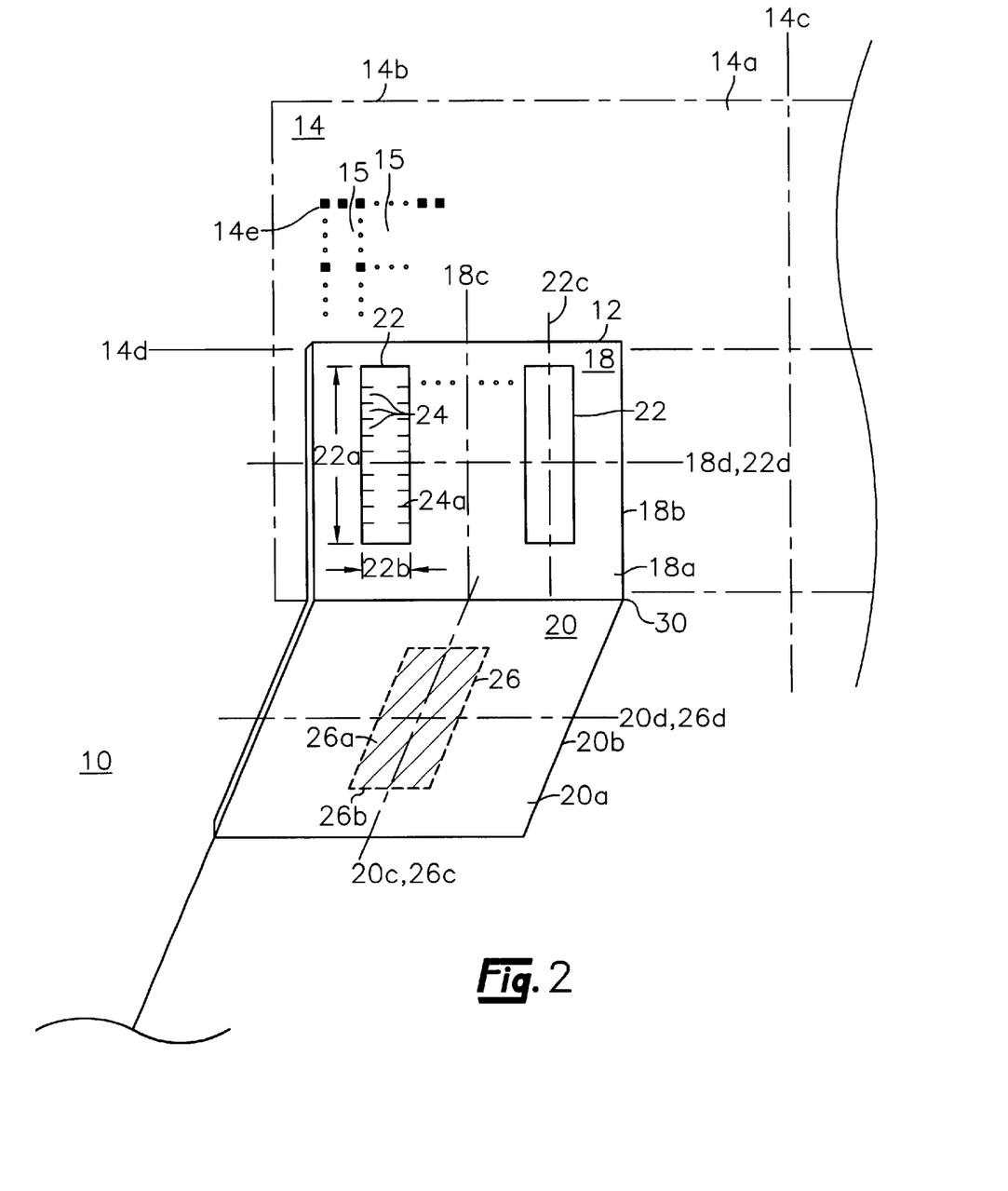
FIG. 2 is a perspective view of a TAB circuit connected to a printhead heater chip and a PCB, according to the present invention.

According to the present invention, as shown in FIG. 2, each of the TAB circuits 12 include a first region 18 and a second region 20. First region 18 further includes a first face 18a, a second face 18b, a first axis 18c and a second axis 18d that is substantially perpendicular to first axis 18c of the first region 18.

Second region 20 includes a first face 20a, a second face 20b, a first axis 20c and a second axis 20d that is substantially perpendicular to first axis 20c of the second region 20. TAB circuit 12 is preferably constructed of polyimide material such as the material available from DuPont Company of Wilimington, Del. under the trade name KAPTON. The TAB circuit also contain metal traces as electrical conduits and a protective cover coat 25 over the traces. The TAB circuit preferably has a width of ranging from about 5 mm to about 20 mm, a length ranging from about 30 mm to about 150 mm, and a thickness ranging from about 25 $\mu$m to about 75 $\mu$m. The dimensions and materials of construction of the TAB circuit are not critical features of the invention except that the length should be sufficient to benefit from the improvements according to the invention. First region 18 of TAB circuit 12 also includes at least two rectangular apertures 22 each aperture 22 having a length 22a and a width 22b.

In a preferred embodiment, first region 18 of TAB circuit 12 contains only two apertures 22. Each aperture has first axis 22c and a second axis 22d that is substantially perpendicular to first axis 22c. First axis 22c extends along the length 22a of aperture 22. Second axis 22d extends along the width 22b of aperture 22. The apertures 22 preferably have a width ranging from about 1 to about 10 mm and a length ranging from about 2 to about 25 mm.

Figure 4A:
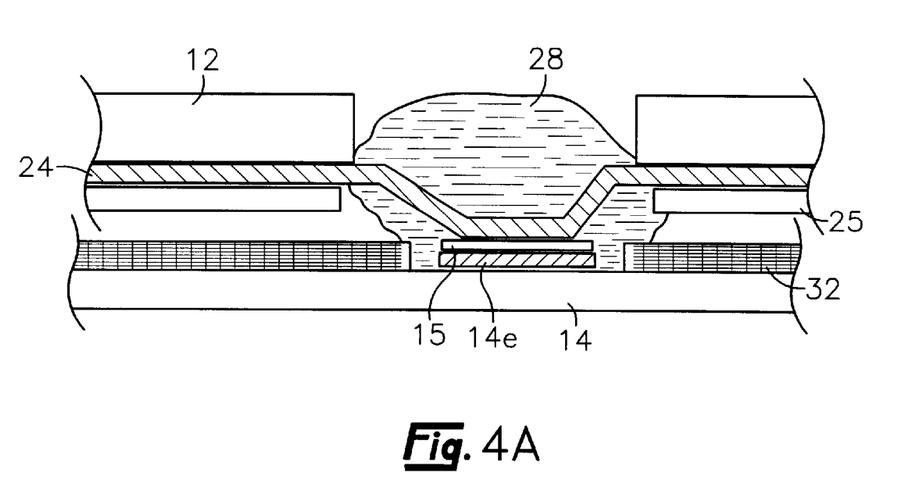
FIGS. 4A and 4B are cross-sectional views of a trace connection through an aperture in a TAB circuit and means for sealing the aperture according to the invention.
Figure 4B:
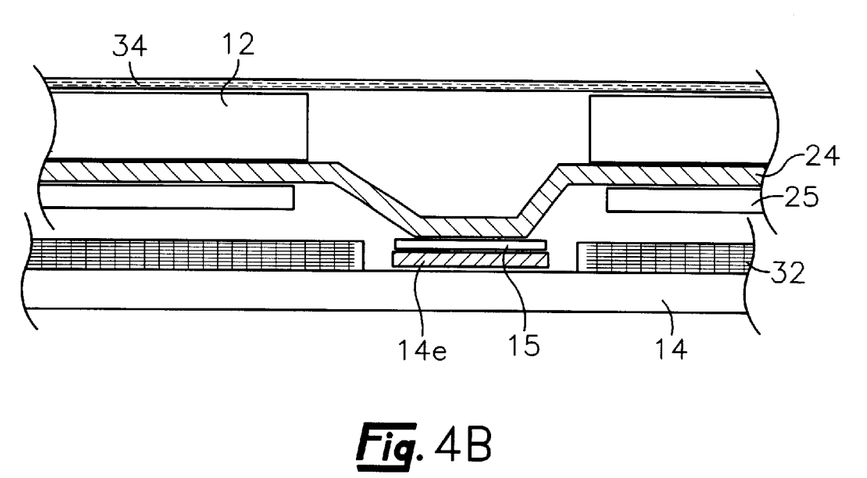

First axis 22c of aperture 22 is substantially parallel to the first axis 18c of the first region 18 of TAB circuit 12. Second axis 22d of aperture 22 is substantially parallel to the second axis 18d of the first region 18 of TAB circuit 12. As shown in FIGS. 4A and 4B, the apertures 22 are substantially enclosed by an encapsulant layer 28, described in detail below, which prevents ink mist from contaminating the connections between the circuitry of the PCB 14 and the conductive traces 24 of TAB circuit 12.

The rectangular apertures 22 are preferably spaced apart from one another a distance ranging from about 5 mm to about 8 mm. Due to the size limitation of printhead cartridge body 10, the apertures 22 are correspondingly constrained to limited geometrical configurations. According to the present invention, it has been determined that rectangular apertures 22, oriented as described, tend to provide the most advantageous geometry for connection to PCB 14.

As shown in FIGS. 2 and 3A–3D, TAB circuit 12 contains at least five conductive traces 24 located on the second face 18b of first region 18 of TAB circuit 12 and on the second face 20b of the second region 20 of TAB circuit 12. In a preferred embodiment, there are at least twenty conductive traces 24 which are preferably constructed of copper, have a length ranging from about 10 mm to about 80 mm, a diameter ranging from about 50 $\mu$m to about 300 $\mu$m and are spaced apart a distance ranging from about 75 $\mu$m to about 250 $\mu$m. Each conductive trace 24 includes a first end 24a, and a second end 24b that is electrically connected to printhead heater chip 26. The first ends 24a of traces 24 are substantially parallel with the second axis 18d of the first region 18 of the TAB circuit 12.

As best shown in FIGS. 1 and 2, printhead cartridge body 10 includes a PCB 14 which is preferably located on the front face 10a of printhead cartridge body 10 in close proximity to the TAB circuits 12. PCB 14 includes a first face 14a, a second face 14b, a first axis 14c and a second axis 14d that is substantially perpendicular to first axis 14c of the PCB 14. In a preferred embodiment, PCB 14 will be constructed of fiberglass reinforced epoxy (FR4) and preferably contains a memory module chip to store printer, ink and/or ink cartridge data. The PCB 14 preferably has a width of ranging from about 15 mm to about 80 mm, a length of ranging from about 10 mm to about 60 mm, and a thickness of ranging from about 0.75 mm to about 2 mm.

The PCB 14 also includes a plurality of conductive contacts 14e, preferably at least 10 conductive contacts 14e. Most preferably, PCB 14 contains from about 20 to about 200 conductive contacts 14e. The conductive contacts are electrically connected to the first ends 24a of the conductive traces 24 of TAB circuit 12. The electrical connection between the conductive contacts 14e and the conductive traces 24 of the TAB provide an electrical pathway for electrical pulse information to flow from the PCB 14 to the printhead heater chip 26. Accordingly, the PCB is provided to make electrical contact between the printer and the printhead via the TAB circuit and to reduce the input/output signals required from a relatively high number of input/output signals for input through the TAB circuits to a relatively smaller number of signals from the printer to the PCB. The reduction is input/output signals is achieved by connecting signals that are either time multiplexed or have a common function. In a preferred embodiment the number of input/output signals at the TAB circuit/PCB interface is about 150 and is reduced to about 70 at the PCB/printer connection interface.

The first face 14a of PCB 14 is located adjacent to the second face 18b of the first region 18 of TAB circuit 12. Alignment of PCB 14 with TAB circuit 12 is achieved by making sure that the first axis 14c of PCB 14 is aligned substantially parallel to the first axis 18c of the first region 18 of TAB circuit 12. As described in more detail below, misalignment problems between the TAB circuit 12 and PCB 14 are diminished according to the present invention. In preferred embodiments of the present invention, three to four TAB circuits 12 are attached to printhead cartridge body 10 and are connected to the PCB 14.

Misalignment problems with regard to attaching the TAB circuit 12 to the PCB 14, are substantially reduced by orienting the length 22a of the rectangular apertures 22 with the first axis 18c of first region 18 of TAB circuit 12. Conductive contacts located on printhead heater chip 26 are normally attached to the second ends 24b of the conductive traces 24 before the TAB circuit is attached to the PCB 14. Since the first region 18 of TAB circuit 12 is normally attached to the PCB 14 after mounting the printhead heater chip 26 on printhead cartridge body 10 misalignment can often occur between the first ends 24a of conductive traces 24 and the conductive contacts 14e of PCB 14. When the TAB circuits 12 are folded over the edge 30 of the cartridge body 10 (FIG. 1) after connecting the conductive traces 24 of the TAB circuit 12 to the conductive contacts 14e of the PCB 14, and the PCB 14 is attached to the cartridge body 10, misalignment is magnified and may cause wrinkling, stress or premature failure of the TAB circuit 12.

By orienting the window as described above, misalignment translation along the direction parallel with aperture length 22a, is effectively minimized.

Referring to FIGS. 3A–3D, a triangle is shown where the x-direction corresponds with the aperture width 22b and the y-direction corresponds with the aperture length 22a. Trigonometric identities aid in determining the associated alignment errors.

$\cos(\Theta) = y/h$ $\sin(\Theta) = x/h$, where $\Theta$ is the misalignment angle;

x is the width direction of the aperture;
y is the length direction of the aperture;
h is the misalignment direction or hypotenuse of the triangle.

Rearranging the above equations and solving for x and y and assuming that $\Theta$ is a small number $\sin(\Theta)*h$ approaches a number larger than h, whereas $\cos(\Theta)*h$ approximates h. Therefore with the above described rectangular aperture 22 orientation, maximum variability is obtained in the x-direction while keeping a tight tolerance in the y-direction.

It is difficult to increase the width in the x-direction of the TAB circuit 12 without a significantly increasing the cost of the TAB circuit. Accordingly, it is important to obtain the most flexibility for alignment along the x-direction. Orienting the apertures 22 with the length parallel to the y-direction thus provides the most flexibility for aligning the windows with respect to the conductive traces 24 which run parallel to the x-direction.

The printhead heater chip 26 which is attached to second region 20 of the TAB circuit 12 has a first face 26a, a second face 26b, a first axis 26c, and a second axis 26d that is substantially perpendicular to first axis 26c. In a preferred embodiment printhead heater chip 26 is comprised of silicon and includes resistive and conductive features deposited on the first face 26a. The chip 26 has a width ranging from about 1 mm to about 10 mm., and a length ranging from about 5 mm to about 30 mm, and a thickness ranging from about 500 μm to about 1000 μm.

As discussed above the printhead heater chip 26 is electrically connected to the second ends 24b of conductive traces 24. These electrical connections allow signals to be transmitted along the conductive traces 24, between the printhead heater chip 26 and PCB 14. The first face 26a of printhead heater chip 26 is located adjacent the second face 20b of the second region 20 of the TAB circuit 12. The first axis 26c of the printhead heater chip 26 is aligned substantially parallel to the first axis 20c of the second region 20 of the TAB circuit 12.

After the TAB circuit is electrically connected to the PCB, the apertures 22 are enclosed by an encapsulant layer 28 to prevent the bonded area from being contaminated by ink mist within the inkjet printer. There are a variety of ways and materials that can be utilized to enclose apertures 22. In a preferred embodiment, the encapsulant layer 28 is an automatically dispensed patterned adhesive.

In other alternative embodiments, the encapsulant layer 28 is selected from an automatically dispensed thermally cured adhesive, an ultra-violet cured adhesive, ink resistant tape containing an exposed adhesive layer, a heat curable B-stage dry material film adhesive or an infra-red formable film.

Now that the structure of the printhead cartridge body 10 for use in an inkjet printer using the unique TAB circuit 12 configuration has been described, a method for attaching the TAB circuit 12 to the PCB 14 of a printhead cartridge body 10 according to the present invention will now be described. Referring to FIG. 2, a TAB circuit 12 having at least two rectangular apertures 22 located in the first region 18 or PCB region 18 of TAB circuit 12, is shown with a printhead heater chip 26 attached to the second face 20b of second region 20. As shown, first axis 20c of second region 20 of the TAB circuit 12 is substantially aligned with first axis 26c of the printhead heater chip 26. Preferably, the printhead heater chip 26 is attached to the TAB circuit 12 before mounting the combination to the printhead cartridge body 10. Substantial alignment of the aforementioned axes ensures a robust electrical connection between the TAB circuit 12 and the printhead heater chip 26 and reduces misalignment of the chip 26 with respect to the cartridge body 10.

Since the TAB circuit 12 is preferably pre-attached to the printhead heater chip 26, attachment of the heater chip 26 to the cartridge body 10 also includes the step of attaching the second region 20 of the TAB circuit 12 to the cartridge body 10. Next the conductive traces 24 of TAB circuit 12 are connected to conductive contacts 14e of the PCB 14 through apertures 22 using a hot bar bonding system.

Figure 3A:
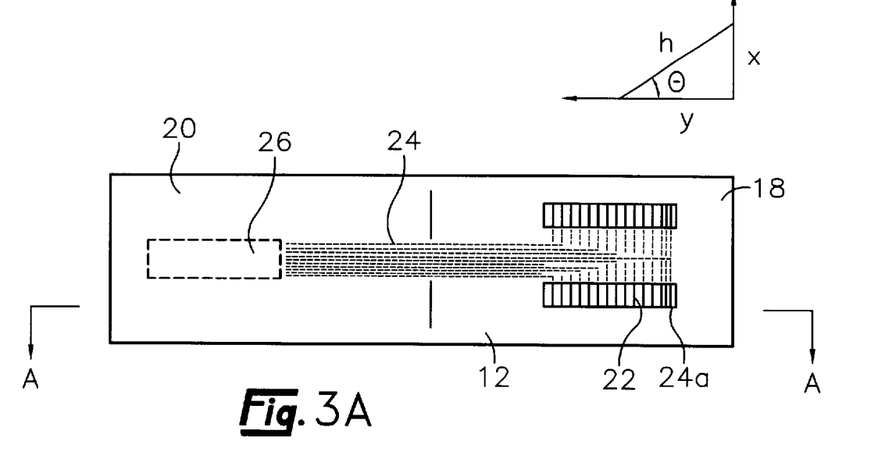
FIG. 3A is a plan view of a TAB circuit according to the present invention.
Figure 3B:
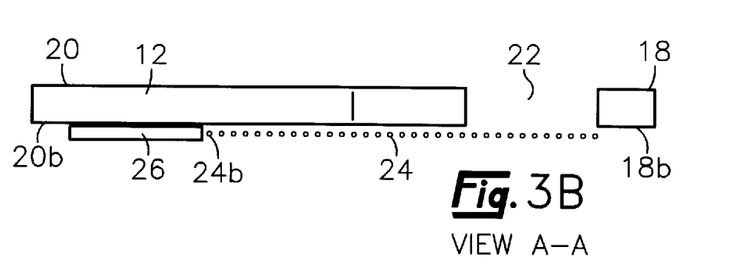
FIG. 3B is a side elevational view of the TAB circuit of FIG. 3A as viewed along line A—A of FIG. 3A, i.e. (VIEW A—A)
Figure 3C:
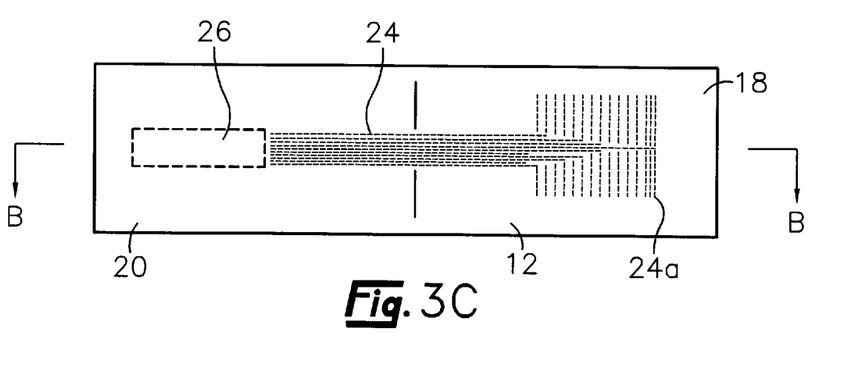
FIG. 3C is a plan view of a prior art TAB circuit.
Figure 3D:
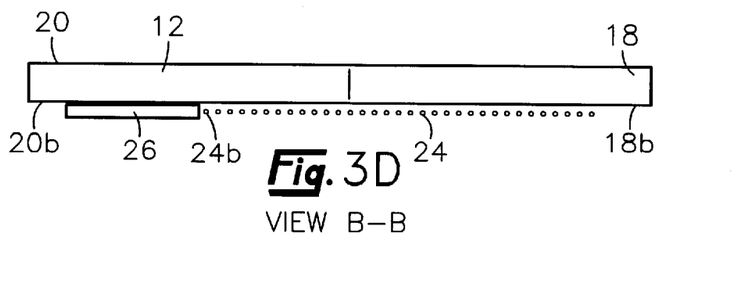
FIG. 3D is a side elevational view of the prior art TAB circuit of FIG. 3C as viewed along line B—B of FIG. 3C, i.e. (VIEW B—B)

Before bonding the TAB circuit 12 to the PCB, the second face 18b of the PCB region 18 of the TAB circuit 12 is positioned relative to the first face 14a of the PCB 14 so that the first axis 18c of the PCB region 18 is aligned substantially with the first axis 14c of the PCB. In some cases, alignment may be difficult due to translated errors from imperfect connection of the TAB circuit 12 to the heater chip 26 and from imperfect mounting of the printhead heater chip 26 to the cartridge body 10. However, the apertures 22 allow visual inspection of the underlying conductive traces 24 of the TAB circuit 12 and the PCB 14 conductive contacts 14e, which allows an inspector or automated inspection device to visually align the two aforementioned axes. Visual alignment is an advantage over alignment methods which are used when the circuitry elements of the TAB circuit are covered by an opaque material as shown in FIGS. 3C–3D.

Moreover, the apertures are designed so that if the TAB circuit 12 to PCB 14 alignment is somewhat skewed, as described in detail above, the electrical connections may still be made between the conductive traces 24 and PCB 14 conductive contacts 14e so that when the TAB circuit 12 is folded over edge 30 of the cartridge body 10, misalignment of the various components does not cause excessive wrinkle or stress on the TAB circuit 12. That is, the geometry and orientation of the apertures 22 gives a safety margin or variance allowance which permits a certain amount of skew or imperfection when mounting the TAB circuit 12 onto the PCB 14 which enables more degrees of freedom with respect to alignment of the various components on the cartridge body 10.

Once the first axis 18c of the PCB region 18 of the TAB circuit 12 is aligned with the first axis 14c of the PCB and the second face 18b of the PCB region 18 is disposed adjacent the first face 14a of the PCB 14, a heating means is applied to the PCB region 18 of the TAB circuit 12, transferring heat through the apertures 22 to the underlying conductive traces 24 of the TAB circuit 12 and conductive contacts 14e of PCB 14, melting the solder 15 on the conductive contacts 14c of the PCB 14 and thereby creating a bond between conductive traces 24 of the TAB circuit 12 and the PCB 14 conductive contacts 14e. The solder 15 is preferably a eutectic tin/lead solder which melts at about 183° C. and is located on the conductive contacts 14e of the PCB 14. A solder mask 32 may be used to protect portions of the PCB 14 from excessive heat during the hot bar soldering step.

Preferably, a hot bar is used to apply the heat to the PCB region 18 of TAB circuit 12. The hot bar transfers heat through the apertures 22 to the underlying solder 15 on the first face 14a of PCB 14 so that the solder 15 melts and forms an electrical connection between the conductive contacts 14e and the conductive traces 24. Prior to the invention, the hot bar had to be applied for a longer duration since the traces and underlying solder 15 were covered by an insulative polymeric material as illustrated in FIGS. 3C–3D. Moreover, determining the proper hot bar application duration was difficult, and was normally done by trial and error, a very inefficient process. Unlike the current invention, conventional flex circuits do not contain apertures 22 which facilitate connecting a TAB circuit 12 to a PCB 14 on a printhead cartridge body for an ink jet printer.

In a preferred embodiment, a ceramic or metal hot bar is utilized as the heating means. However, those skilled in the art will realize that other heating means could be applied to the PCB region 18 of TAB circuit 12 and attain the desired rate of solder 15 flow from PCB 14, thereby connecting the conductive traces 24 of TAB circuit 12 and the conductive contacts 14e of PCB 14.

Notwithstanding, the applicants have determined that hot bar as described tends to be an efficient and cost effective electrical connecting method. In addition, if inspection of the bonded area determines that the resulting electrical connection is not sufficient, that is, there may be a short or an open circuit, the apertures 22 permit the connections to be 'reworked' without removing the entire TAB circuit 12, or any portion thereof from the PCB 14. Not having to remove the TAB circuit 12 from the PCB 14 for repair, not only saves time but also saves costs since the TAB circuit 12 and PCB 14 are usually destroyed during the removal process.

Once the conductive traces 24 of the TAB circuit 12 are electrically connected. i.e. soldered, to the conductive contacts 14e of PCB 14, an encapsulant 28 is applied to the apertures 22 of the TAB circuit 12. Since the TAB circuit 12 is being used within an inkjet printer, ink mist can potentially accumulate on any exposed inkjet printer components. Ink is highly corrosive and can cause electrical problems within the inkjet printer, such as electrical shorts or opens in the bonded area. Therefore, a step is needed to seal the apertures 22 to protect the aforementioned electrical connections and is provided by the present invention.

In a preferred embodiment, the step of applying an encapsulant 28 includes applying an automatically dispensed patterned adhesive. A CAMALOT dispense unit available from CAMALOT division of Speedline Technologies, Inc. of Haverhill Mass. is an automatic unit which can apply an adhesive to the apertures 22 in a variety of patterns to provide an ink mist seal while also providing mechanical strength to the bonded area. The adhesive used may be selected from a thermal, ultra violet (UV), and/or a heat curable adhesive.

Referring to FIG. 4B, another method for providing an ink mist seal is shown. This alternative method includes placing an ink resistant tape 34, such as KAPTON tape having an adhesive layer on one side over the apertures 22. Since only ink mist will most likely be present in the aperture area, a substantially ink tight seal is not required. The taping step can be done manually or can be automated. Taping provides faster throughput, but does not add as much mechanical strength to the bonded area as the aforementioned adhesive material.

An additional means of providing mechanical strength to the bonded area is to utilize a film adhesive for bonding the TAB circuit 12 to the PCB 14. A B-stage dry material film such as a material available from Ablestik Laboratories of Rancho Dominguez, Calif. under the tradename ABLE-FILM 506 could also be placed over the bonded area and then heat cured in an oven. Also, a heat scalable film such as a thermoplastic polypropylene or polyethylene material could be used over the bonded area. This last variation would be formed by means of an infrared lamp, whereby the film conforms to the apertures 22 during heating and provides a stronger seal with respect to the apertures 22.

It is contemplated, and will be apparent to those skilled in the art from the preceding description and the accompanying drawings, that modifications and changes may be made in the embodiments of the invention. Accordingly, it is expressly intended that the foregoing description and the accompanying drawings are illustrative of preferred embodiments only, not limiting thereto, and that the true spirit and scope of the present invention be determined by reference to the appended claims.

What is claimed is:

1. A printhead cartridge body for use in an inkjet printer, the printhead cartridge body comprising:
   at least one TAB circuit, including:
      a first region, having a first face and a second face and a first axis and a second axis substantially perpendicular to the first axis,
      a second region, having a first face and a second face and a first axis and a second axis substantially perpendicular to the first axis,
      a plurality of conductive traces located on the second face of the first region and on the second face of the second region, each trace having a first end and a second end, wherein the first end of each trace is substantially parallel with the second axis of the first region, and
      at least two rectangular apertures disposed on the first region, each aperture having a length and a width, a first axis along a length thereof and a second axis along the width thereof, wherein the first axis of each aperture is aligned with the first axis of the first region of the TAB circuit and the second axis of each aperture is aligned with the second axis of the first region of the TAB circuit,
   a PCB, including:
      a first face and a second face,
      a first axis and a second axis substantially perpendicular to the first axis, and
      a plurality of conductive contacts, wherein the conductive contacts arc electrically connected to the first ends of the conductive traces, wherein the first face of the PCB is disposed adjacent the second face of the first region of the TAB circuit, wherein the first axis of the PCB is aligned substantially parallel with the first axis of the first region of the TAB circuit,
   at least one printhead heater chip, including:

a first face and a second face, a first axis and a second axis substantially perpendicular to the first axis, and a plurality of conductive contacts, wherein the conductive contacts are electrically connected to the second ends of the conductive traces, wherein the first face of the printhead heater chip is disposed adjacent the second face of the second region of the TAB circuit, wherein the first axis of the printhead heater chip is aligned substantially parallel with the first axis of the second region of the TAB circuit, and an encapsulant layer substantially enclosing the rectangular apertures to prevent ink mist from penetrating the apertures.

2. The printhead cartridge body of claim 1, wherein the encapsulant layer is selected from the group consisting of a thermally curable adhesive, an ultra-violet curable adhesive, an ink resistant adhesive tape, a heat curable B-stage dry material film adhesive, a thermoplastic polymeric material and an infra-red curable film.

3. The printhead cartridge body of claim 1, wherein the PCB comprises fiberglass reinforced epoxy containing conductive contacts thereon, the circuit board having a width ranging from about 15 mm to about 80 mm, a length of ranging from about 10 mm to about 60 mm and a thickness ranging from about 0.75 mm to about 2 mm.

4. The printhead cartridge body of claim 1, wherein the TAB circuit comprises a polyimide material and has a width ranging from about 5 mm to about 20 mm, a length ranging from about 30 mm to about 150 mm and a thickness ranging from about 25 $\mu$m to about 75 $\mu$m.

5. The printhead cartridge body of claim 1, wherein the apertures have a width ranging from about 1 mm to about 10 mm and a length ranging from about 2 mm to about 25 mm.

6. The printhead cartridge body of claim 1, wherein the PCB has at least 10 conductive contacts for electrically connecting to corresponding conductive traces adjacent the apertures of the TAB circuit.

7. The printhead cartridge body of claim 1, wherein the printhead heater chip has a width ranging from about 1 mm to about 10 mm, a length ranging from about 5 mm to about 30 mm and a thickness ranging from about 500 $\mu$m to about 1000 $\mu$m.

8. The printhead cartridge body of claim 1, wherein the TAB circuit contains at least 20 conductive traces that are constructed of copper, the traces having a length ranging from about 10 mm to about 80 mm and a diameter ranging from about 50 $\mu$m to about 300 $\mu$m.

9. A TAB circuit for attachment to a PCB and to a printhead heater chip, the TAB circuit comprising:

a first region, having a first face and a second face and a first axis and a second axis substantially perpendicular to the first axis, a second region, having a first face and a second face and a first axis and a second axis substantially perpendicular to the first axis, a plurality of conductive traces located on the second face of the first region and on the second face of the second region, each trace having a first end and a second end, wherein the first end of each trace is substantially parallel with the second axis of the first region and wherein the conductive traces on the second face of the second region are connected to the printhead heater chip, and at least two rectangular apertures disposed to the first region, each aperture having a length and a width, a first axis along the length thereof and a second axis along the width thereof, wherein the first axis of each aperture is aligned with the first axis of the first region of the TAB circuit and the second axis of each aperture is aligned with the second axis of the first region of the TAB circuit.

10. The TAB circuit of claim 9, wherein there are at least 5 conductive copper traces having a length ranging from about 10 mm to about 80 mm and a diameter ranging from about 50 $\mu$m to about 300 $\mu$m.

11. The TAB circuit of claim 9, wherein the apertures have a width ranging from about 1 mm to about 10 mm, and a length ranging from about 2 mm to about 25 mm.

12. The TAB circuit of claim 9 comprising a polyimide material having a width ranging from about 5 mm to about 20 mm, a length ranging from about 30 mm to about 150 mm, and a thickness ranging from about 25 $\mu$m to about 75 $\mu$m.

13. A method connecting a TAB to a PCB disposed in a printhead cartridge body for use in an inkjet printer, the method comprising the steps of:

providing a TAB circuit having a first face and a second face and having at least two elongate apertures disposed in a circuit board region thereof, wherein the apertures have a length axis and a width axis and the length axis of the apertures is substantially aligned with a length axis of the TAB circuit and wherein the TAB circuit contains electrical traces on the second face thereof which traces are disposed in the apertures and are substantially aligned with the width axes thereof, attaching a printhead region on a first end of the TAB circuit to an inkjet printer printhead cartridge body, the TAB circuit having attached thereto a printhead heater chip in a printhead region thereof, disposing the circuit board region on a second end of the TAB circuit adjacent a first face of the PCB so that electrical contact pads of the PCB are substantially aligned with the electrical traces, applying a heating means to traces from the first face side of the TAB circuit through the apertures thereby fixedly connecting the traces of the TAB circuit to contact pads on the PCB, applying a sealant to the apertures from the first face side of the TAB circuit.

14. The method of claim 13, wherein the step of applying a sealant includes applying a sealant selected from the group consisting of a thermally curable adhesive, an ultra-violet curable adhesive, an ink resistant adhesive tape, a heat curable B-stage dry material film adhesive, a thermoplastic polymeric material and an infra-red curable film.

15. The method of claim 13, wherein the step of applying a heating means includes applying a metal or ceramic hot bar.

* * * * *